United States Patent
Ahmed et al.

(10) Patent No.: US 7,181,668 B2
(45) Date of Patent: Feb. 20, 2007

(54) METHOD AND SYSTEM OF DECODING AN ENCODED DATA BLOCK

(75) Inventors: Walid Ahmed, Eatontown, NJ (US); Luis E. Caceres, Hackettstown, NJ (US); Jin-Ghee Goh, Beijing (CN)

(73) Assignee: Lucent Technologies Inc., Murray Hill, NJ (US)

( * ) Notice: Subject to any disclaimer, the term of this patent is extended or adjusted under 35 U.S.C. 154(b) by 401 days.

(21) Appl. No.: 10/108,559

(22) Filed: Mar. 29, 2002

(65) Prior Publication Data
US 2003/0188247 A1    Oct. 2, 2003

(51) Int. Cl.
*H03M 13/00*    (2006.01)
(52) U.S. Cl. ............................................. 714/755
(58) Field of Classification Search .............. 714/755, 714/746, 752, 758, 759, 786, 774, 776
See application file for complete search history.

(56) References Cited

U.S. PATENT DOCUMENTS 5,889,791 A * 3/1999 Yang ........................ 714/752
6,320,520 B1 * 11/2001 Luby ........................ 341/50

* cited by examiner

*Primary Examiner*—James C Kerveros

(57) ABSTRACT

A method and system of decoding data including a padding unit, interleaver unit and decoder. A block of data symbols where each data symbol represents an encoded data bit, is received by the padding unit. The padding unit determines if the block data symbols has a number of data symbols equal to a threshold value M. If the number of data symbols is less than M, the padding unit pads the block of data symbols with at least one padding symbol. The decoder decodes the padded block of data symbols.

11 Claims, 2 Drawing Sheets

METHOD AND SYSTEM OF DECODING AN ENCODED DATA BLOCK

BACKGROUND OF THE INVENTION

1. Field of the Invention

The invention relates to a method and system of decoding data blocks of transmitted signals and in particular, turbo decoding.

2. Description of the Prior Art

Decoders and their related encoders are typically used in signal processing. There are various forms of encoders and decoders. One example of an encoder is a convolution encoder. Examples of decoders include Viterbi and turbo decoders. However, other encoders and decoders are well known in the art. The decision to use a particular decoder is generally based on the performance and complexity constraints imposed by a system.

In some decoding situations, regardless of the type of decoder that is selected, the minimum number of data bits in a data block required for the selected decoder to function properly may vary depending upon the hardware which embodies the decoder. For example, a decoder may have a minimum bit recognition requirement of a certain number of bits and fail to recognize a data block of less than the certain number of bits.

SUMMARY

In a method and system for decoding an encoded data block having a number of data symbols N less than the minimum number of data symbols M required for proper operation of the decoder, a padding unit counts the number of data symbols N in an encoded data block and determines if the number of data symbols is less than M. If the number of data symbols N is not less than M, the padding unit allows the encoded data block to pass through the padding unit unchanged and the decoder functions as is well known in the art.

If the number of data symbols N in an encoded data block is less than M then the padding unit pads the encoded data block by adding a number of padding symbols X to the data symbols so that N+X=M. The padding symbols may be placed into the buffer in various positions including front padding, back padding, middle padding or any other method known in the art. Additionally, the padding unit notifies an interleaving processor that padding is occurring and the number of data symbols N and position of padding symbols.

The interleaver processor stores a padded interleaving table corresponding to each possible arrangement of data symbols and padding symbols and outputs a padded interleaver table to the padding unit corresponding to the padded encoded data block.

The padding unit transfers the padded interleaver table and associated padded encoded data block to the decoder. The decoder which may be a turbo decoder or other decoder well known in the art, functions as is well known in the art and the use of the padding symbols simply tricks the decoder into decoding a number of data symbols less than M.

Thus, by using the padding symbols, the decoder properly decodes data blocks containing less than M data symbols.

BRIEF DESCRIPTION OF THE FIGURES

The present invention will become more fully understood from the detailed description given herein below and the accompanying drawings which are given by way of illustration only, wherein like reference numerals designate corresponding parts in the various drawings, and wherein.

DETAILED DESCRIPTION OF THE PREFERRED EMBODIMENTS

Figure 1:
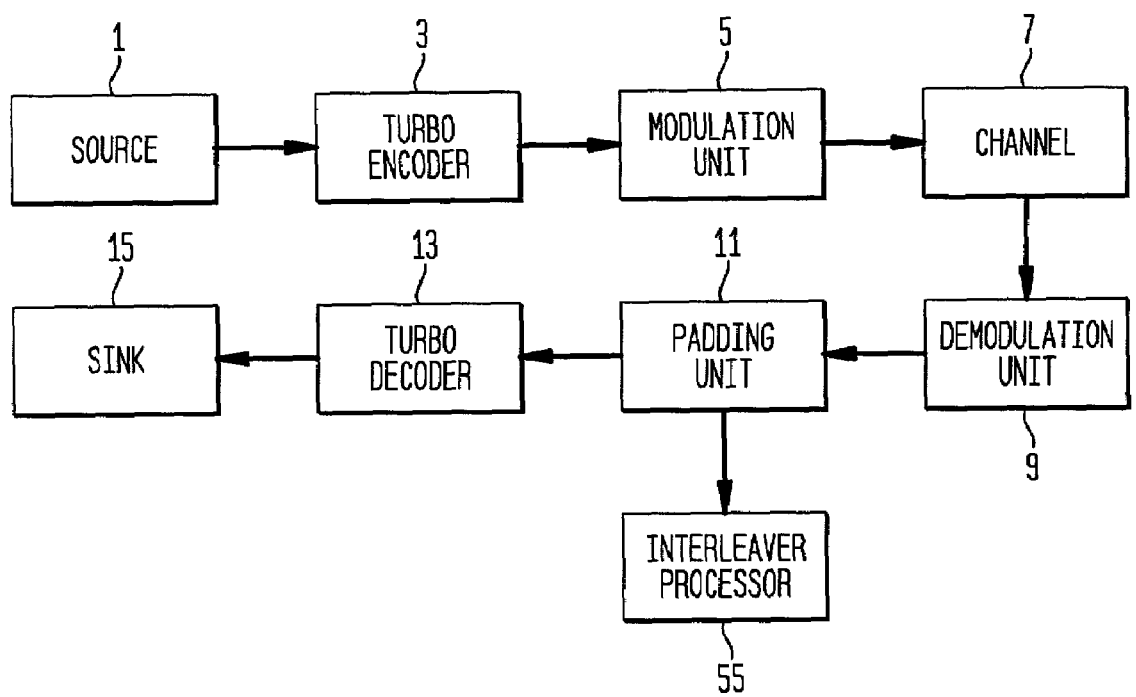
FIG. 1 depicts the signal encode, transmit, receive and decode process according to one embodiment of the present invention.

FIG. 1 depicts an example of the signal transmit and receive process relative to encoding and decoding data using an embodiment of the method of this invention.

A source 1 generates a signal including data blocks of a number of bits. Each data block may have an equal number of bits or data blocks of varying numbers of bits may be generated. The source 1 may be any signal generator well known in the art. A turbo encoder 3 encodes the bits and data blocks by methods that are well known in the art and as a result, no further description is provided. Once the data blocks are encoded, the data bits are referred to as symbols because the bits may be corrupted during encoding, modulation and transmission.

Figure 2:
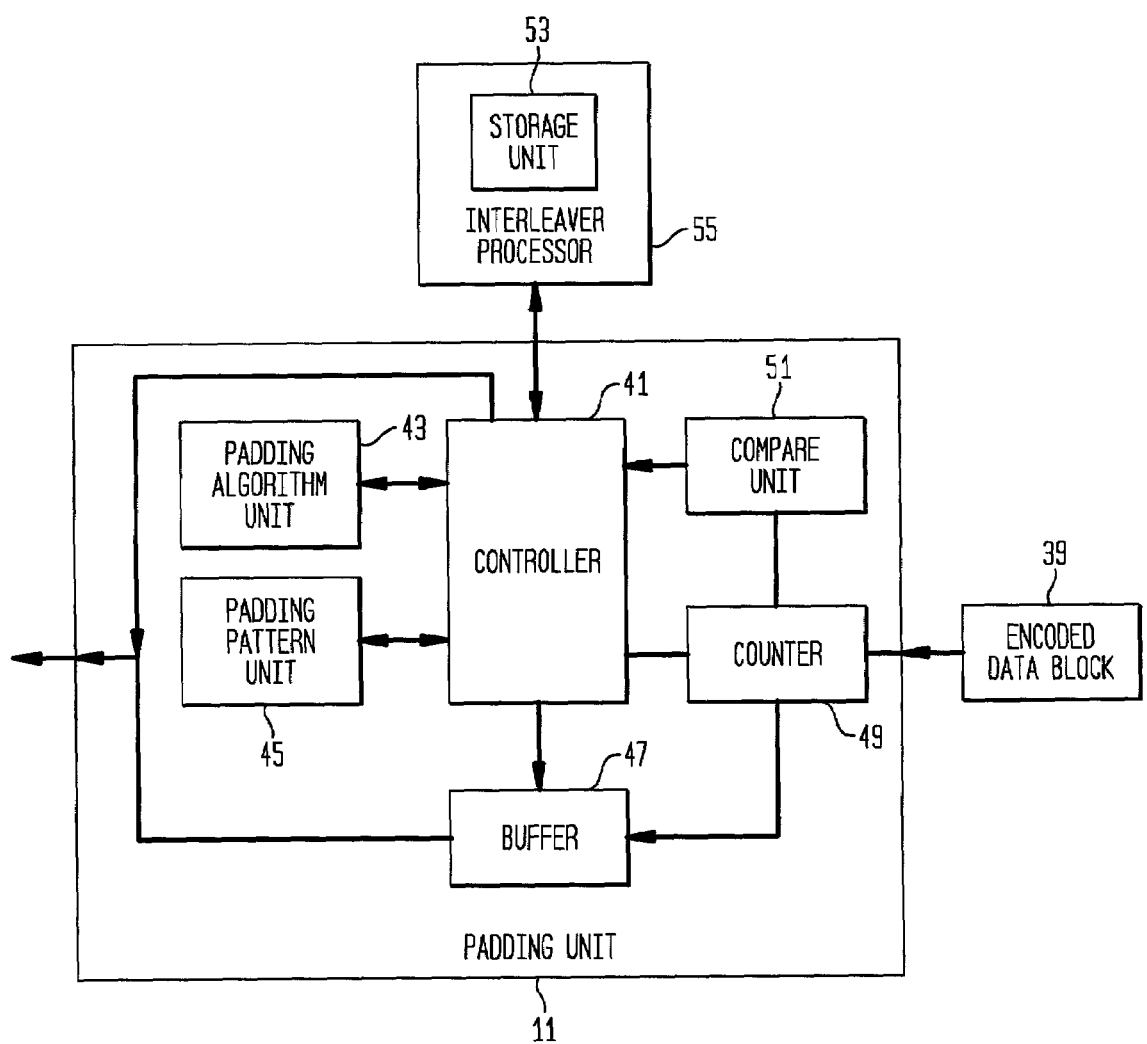
FIG. 2 depicts the padding unit and interleaver processor according to one embodiment of the present invention.

The signal is then modulated by modulation unit 5, which may be any modulation unit well known in the art. Channel 7 is utilized during transmission of the encoded data. For example, channel 7 may be an air interface. A demodulator unit 9 receives and demodulates the signal. The demodulator unit 9 may be any suitable demodulator unit well known in the art. A padding unit 11 places the demodulated data blocks into a buffer 47 (as shown in FIG. 2) and if necessary, pads the data blocks. Additionally, the interleaver processor 55 supplies a padded interleaver table corresponding to the padded data block to the padding unit. A turbo decoder 13 decodes the data block using the padded interleaver table. The turbo decoder 13 may be any suitable turbo decoder in the art. Lastly, the decoded data blocks are sent to the appropriate sink 15 for storage or use.

FIG. 2 illustrates an embodiment of the padding unit 11 in detail. The padding unit includes a counter 49, compare unit 51, buffer 47, a controller 41 and a padding position unit 43 and padding pattern unit 45. An interleaver processor 55 and storage unit 53 are also depicted in FIG. 2.

The encoded data block 39 enters the padding unit 11 and the counter 49 begins operation by counting the number of symbols N in the data block. The counter 49 then communicates the number of symbols N to the compare unit 51 and the compare unit 51 determines whether or not N is greater than, equal to, or less than a threshold M, which is the minimum number of symbols required in a data block for proper operation of the decoder. The compare unit 51 notifies the controller 41 of the relationship between N and M.

Once the symbols in the encoded data block 39 are counted, the counter 49 places the encoded data block 39 into buffer 47. If the compare unit 51 determined that N is greater than or equal to M, then the controller 41 allows the data to be output to the decoder 13. On the other hand, if the compare unit 51 determined that N is less than M, then the controller 41 begins the padding operation and pads the symbols in buffer 47 by adding padding symbols X such that N+X=M. Additionally, the controller 41 notifies the interleaver processor 55 of the number of data symbols N in the data block and the positioning of the padding symbols in the buffer relative to the data symbols.

It is preferable to pad the data blocks with less than M data symbols in such a manner as to minimize performance loss with respect to the case where no padding is performed. As shown in FIG. 2, the padding unit 11 includes a padding position unit 43 and a padding pattern unit 45, which assist the controller 41 in performing the padding.

The padding position unit 43 contains the instructions as to where to place the padding symbols in the buffer 47. There are three types of padding positions. "Back padding" refers to inserting all the padding symbols X into the buffer 47 after or behind the end of the data symbols N of the encoded data block 39. The second type of padding is called "middle padding" and refers to inserting padding symbols X into the buffer 47 between the data symbols N of the encoded data block 39. The third type of padding is called "front padding" and refers to inserting all the padding symbols X into the buffer 47 in front of the data symbols N of the encoded data block 39.

Of the three padding positions, front padding or back padding are preferred because insertion of the padding symbols in the middle of the data block will puncture the data block and create a resulting loss of performance. Additionally, to place padding symbols in any of the above positions, it may be necessary to move the encoded data block 39 or a portion thereof within the buffer 47 in order to free the appropriate space in the buffer 47 for the padding symbols.

A padding pattern unit 45 directs the specific padding symbols to be used to pad the data block. Although the padding pattern may incorporate a symbol representing any number as a padding symbol, the optimum padding symbols for back padding have been determined to be symbols representing zeros, and the optimum padding symbols for front padding have been determined to be symbols representing large negative numbers (e.g., −1,000,000).

For each block of padding symbols, the desired padding position and padding symbols are preset in the padding algorithm unit 43 and padding pattern unit 45 prior to operation of the decoder 13 for each data block. However, the invention is not limited to the preset padding positions and symbols. Both the padding symbol and pattern may be changed for subsequent blocks of padding symbols, if others become more desirable.

Additionally, when the number of data symbols in the data block is less than M the controller 41 notifies the interleaver processor 55 of the number of data symbols N in the data block and the positioning of the padding symbols in the buffer 47 relative to the data symbols.

The interleaver processor 55 has a storage unit 53, which contains a padded interleaving table corresponding to each of the possible combinations of data symbols and padding symbols with respect to positioning and number. Since padding only occurs for data blocks with less than M data symbols, an interleaver table is stored for each possible number of data symbols such as 1 through M and for each number of data symbols a separate table is stored for each possible position of padding symbols. Each interleaving table includes M bits, which includes interleaving bits D and padding bits F, where M=D+F.

The interleaver processor 55 selects the interleaving table from storage unit 53 that corresponds to the padded data block. For example, if the padded data block has a total of 80 data symbols and 40 padding symbols positioned by back padding, an interleaving table is selected with 80 interleaving bits and 40 padding symbols positioned by back padding.

The interleaver processor 55 transfers the selected padded interleaver table to the controller 41 and the controller 41 outputs the padded interleaver table and the padded data block to the decoder 13.

The operation of a turbo decoder 13 is well known in the art, and therefore is not described in detail. However, in a preferred embodiment, the method of turbo decoding is different with reference to the use of interleaving tables. For example, as discussed above when the data symbols in the data block are padded, a corresponding padded interleaver table is selected by the interleaver processor and output to the decoder 13 by the padding unit 11. As a result, when the number of data symbols in a data block is less than M, the decoder 13 uses a padded interleaver table to decode the data. When the number of data symbols in a data block is greater than or equal to M the decoder functions by using an unpadded interleaving table as is well known in the art.

Upon completion of the decoding process, the decoder 13 outputs a data block including data bits substantially equivalent to the data bits in the data block prior to encoding.

The addition of the padding symbols to encoded data blocks until the total number of symbols (N+X) is equal to the threshold M, essentially tricks the decoder 13 into decoding with improved performance because the total number of data symbols passed to the decoder 13 is at least equal to M.

The invention being thus described, it will be obvious that the same may be varied in many ways. Such variations are not to be regarded as a departure from the spirit and scope of the invention, and all such modifications are intended to be included within the scope of the following claims.

We claim:

1. A method of decoding a received data block, comprising the steps of:

receiving, over a channel, an encoded symbol block of at least one data symbol, wherein each data symbol corresponds to an encoded data bit;

padding the received symbol block with at least one padding symbol;

decoding the padded symbol block based on an amount of padding using a decoder; and providing a plurality of padded interleaver tables including one first entry associated with each data symbol in the symbol block and one second entry associated with each padding symbol, wherein a first padded interleaver table of the plurality of padded interleaver tables has a first number of first entries, a second padded interleaver of the plurality of padded interleaver tables has a second number of first entries, and the decoding step includes sending the padded symbol block with N data symbols and the padded interleaver table with D first entries to the decoder, where N=D.

2. The method of claim 1, wherein the receiving step receives the encoded symbol block and places the encoded symbol block into a buffer, and the padding step pads the received symbol block by placing at least one padding symbol into the buffer before the received symbol block.

3. The method of claim 1, wherein the receiving step receives the encoded symbol block and places the encoded symbol block into a buffer; and the padding step pads the received symbol block by placing at least one padding symbol into the buffer after the received symbol block.

4. The method of claim 1, wherein
the receiving step receives the encoded symbol block and places the encoded symbol block into a buffer; and
the padding step pads the received symbol block by placing at least one padding symbol into the buffer in between at least two symbols in the received symbol block.

5. The method of claim 1 wherein, the padding symbol is embodied by symbols representing zero and symbols representing a large negative number.

6. A method of decoding data, comprising the steps of:
receiving, over a channel, an encoded block of data symbols wherein the encoded block includes at least one data symbol and each data symbol represents an encoded data bit;
determining if the received block of data symbols has a number of data symbols equal to a threshold value M;
padding the received block of data symbols with at least one padding symbol if the number of data symbols is less than M;
decoding the padded block of data symbols based on a number of padding symbols added to the received block of data symbols; and
providing a plurality of padded interleaver tables including a number of first entries D including a first entry associated with each data symbol and a second entry associated with each padding symbol,
wherein a first padded interleaver table of the plurality of padded interleaver tables has a first number of first entries,
a second padded interleaver of the plurality of padded interleaver tables has a second number of first entries,
the number of data symbols in the block of data symbols is N, and
the decoding step includes sending the padded block of data symbols with N data symbols and the padded interleaver table with D decoding symbols to the decoder, where N=D, if the number of data symbols N is less than M.

7. The method of claim 6, wherein
the determining step counts the data symbols in the received block of data symbols and compares the counted number to the threshold value M.

8. The method of claim 6, wherein
the receiving step receives the encoded block of data symbols and places the data symbols into a buffer, and
the padding step pads the received block of data symbols by placing at least one padding symbol into the buffer before the received block of data symbols.

9. The method of claim 6, wherein
the receiving step receives the encoded block of data symbols and places the data symbols into a buffer, and
the padding step pads the received block of data symbols by placing padding symbols into the buffer after the received block of data symbols.

10. The method of claim 6, wherein
the receiving step receives the encoded block of data symbols and places the data symbols into a buffer, and
the padding step pads the received block of data symbols by placing padding symbols into the buffer in between at least two data symbols in the received block of data symbols.

11. The method of claim 6, wherein the padding symbols are embodied by symbols representing zero and symbols representing a large negative number.

* * * * *